(12) United States Patent
Khlat

(10) Patent No.: US 11,482,998 B2
(45) Date of Patent: Oct. 25, 2022

(54) RADIO FREQUENCY SWITCHING CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 365 days.

(21) Appl. No.: 16/745,436

(22) Filed: Jan. 17, 2020

(65) Prior Publication Data

US 2020/0395937 A1    Dec. 17, 2020

Related U.S. Application Data

(60) Provisional application No. 62/860,276, filed on Jun. 12, 2019.

(51) Int. Cl.
| | |
|---|---|
| *H03K 17/16* | (2006.01) |
| *H03K 17/687* | (2006.01) |
| *H03K 17/693* | (2006.01) |
| *H04B 1/44* | (2006.01) |
| *H03K 17/10* | (2006.01) |

(52) U.S. Cl.
CPC ............. *H03K 17/693* (2013.01); *H04B 1/44* (2013.01); *H03K 17/102* (2013.01)

(58) Field of Classification Search
None
See application file for complete search history.

(56) References Cited

U.S. PATENT DOCUMENTS

| | | | | |
|---|---|---|---|---|
| 7,737,810 B2 * | 6/2010 | Chan | ...................... | H01H 9/548 335/78 |
| 7,864,491 B1 * | 1/2011 | Bauder | .................... | H01H 9/30 361/13 |
| 9,484,168 B2 * | 11/2016 | Pessina | .................. | H01H 9/542 |
| 10,033,179 B2 * | 7/2018 | Fitzgerald | .......... | H01H 59/0009 |
| 10,763,066 B2 * | 9/2020 | Bauer | .................. | H03K 17/687 |
| 11,139,125 B2 * | 10/2021 | Muri | ...................... | H01H 9/548 |
| 2004/0113713 A1 * | 6/2004 | Zipper | ................. | H01H 1/0036 333/105 |
| 2009/0272634 A1 * | 11/2009 | Ehlers | ................ | H01H 59/0009 200/181 |

* cited by examiner

*Primary Examiner* — Kenneth B Wells
(74) *Attorney, Agent, or Firm* — Withrow & Terranova, P.L.L.C.

(57) ABSTRACT

A radio frequency (RF) switching circuit is provided. The RF switching circuit includes a low-figure-of-merit (FOM) switching path that requires a longer duration to be switched on and off and a high-FOM switching path having a higher FOM than the low-FOM switching path but that can be switched on and off faster than the low-FOM switching path. In one aspect, the RF switching circuit passes an RF signal via the high-FOM switching path while toggling the low-FOM switching path to help reduce overall switching time of the RF switching circuit. In another aspect, the RF switching circuit passes the RF signal via the low-FOM switching path whenever the low-FOM switching path is switched on to help improve overall FOM of the RF switching circuit. As a result, the RF switching circuit may achieve a good overall response time and a reasonable overall FOM.

20 Claims, 6 Drawing Sheets

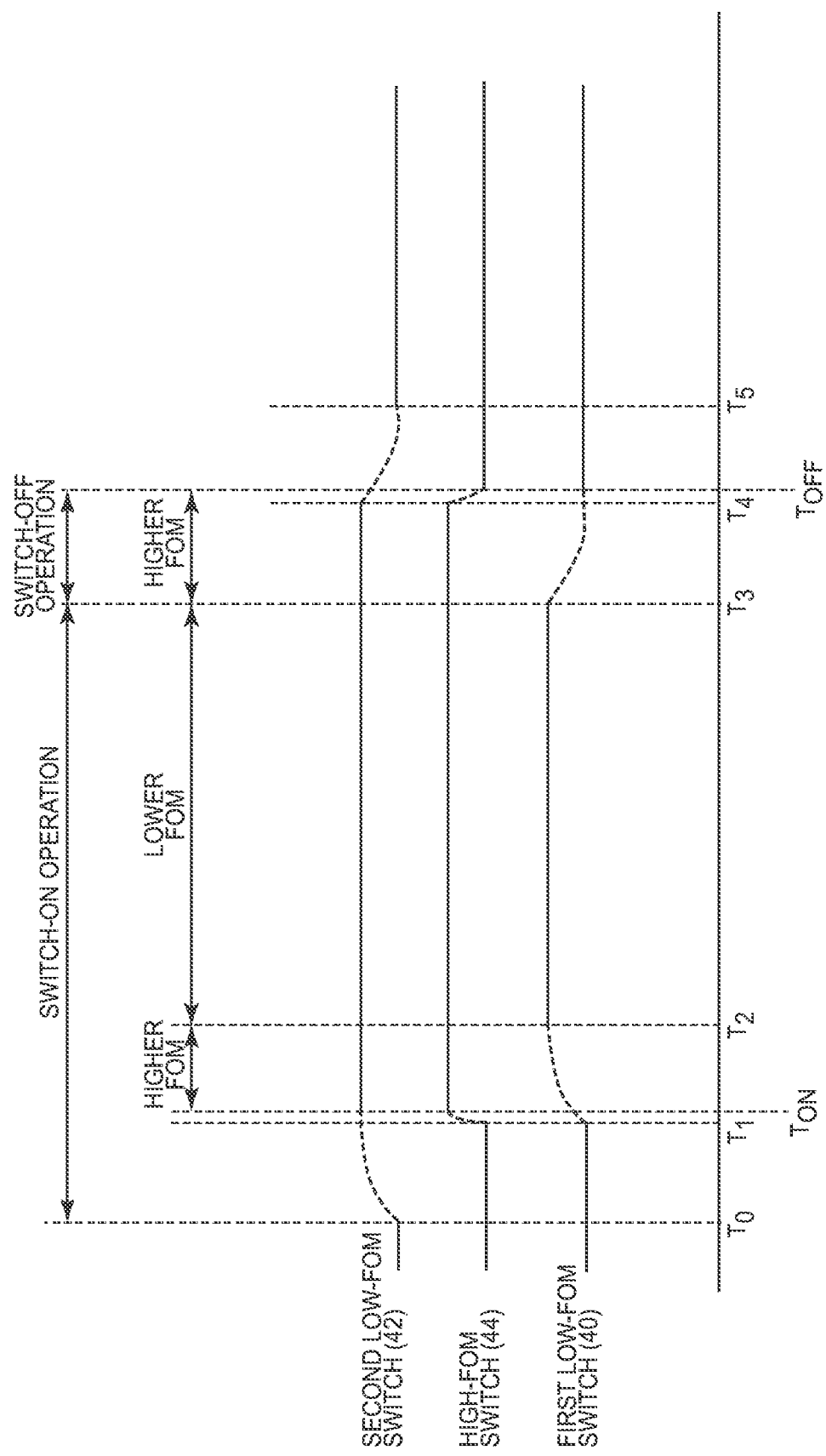

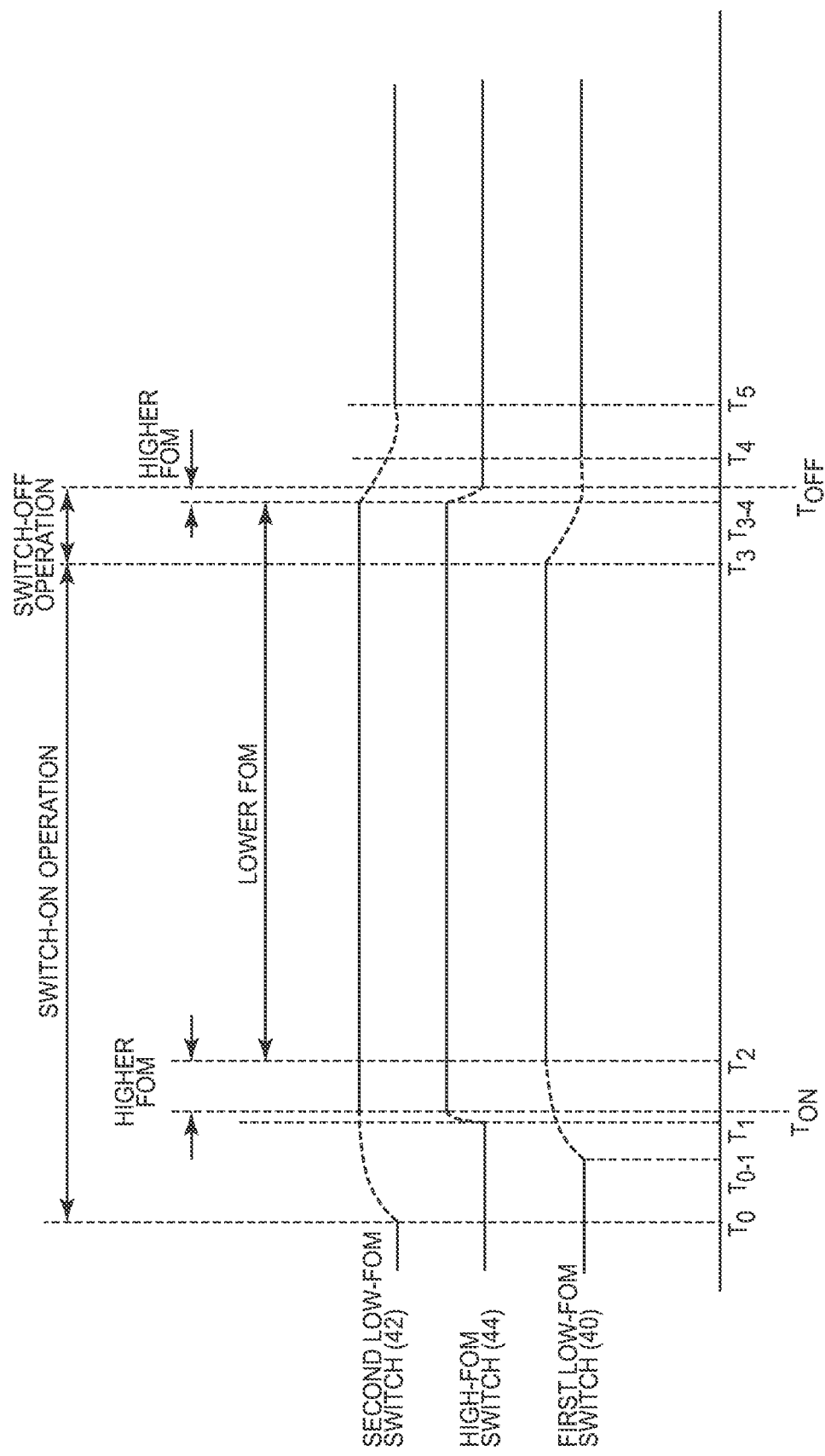

RADIO FREQUENCY SWITCHING CIRCUIT

RELATED APPLICATIONS

This application claims the benefit of U.S. provisional patent application Ser. No. 62/860,276, filed on Jun. 12, 2019, the disclosure of which is incorporated herein by reference in its entirety.

FIELD OF THE DISCLOSURE

The technology of the disclosure relates generally to operating microelectromechanical systems (MEMS) switches in an electrical circuit.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE) and fifth-generation new-radio (5G-NR). In this regard, a mobile communication device may need to operate in a variety of operation modes, such as multiple-input multiple-output (MIMO) spatial diversity, MIMO spatial multiplexing, and/or radio frequency (RF) beamforming. In addition, it may be necessary for the mobile communication device to communicate an RF signal (s), either concurrently or alternately, in different RF bands associated with different wireless communication technologies. As such, the mobile communication device may include a number of RF filters for communicating the RF signal(s) in different RF bands. Accordingly, the mobile communication device may employ a number of switches to toggle the RF signal(s) between different RF filters in different operation modes.

Notably, a conventional switch, such as a silicon-on-insulator (SOI) switch, can be switched on and off faster. However, the SOI switch may create a relatively higher on-resistance ($R_{ON}$) when switched on and a relatively higher off-capacitance ($C_{OFF}$) when switched off. Accordingly, the conventional switch may correspond to a higher figure-of-merit (FOM) (FOM=$R_{ON} \times C_{OFF}$) that can cause unwanted insertion loss to degrade RF efficiency and/or performance of the mobile communication device.

In contrast, a microelectromechanical systems (MEMS) switch, which may take longer to be switched on and off, typically has a FOM that is at least ⅓ lower than the FOM of the conventional SOI switch. As a result, it may be possible to reduce the unwanted insertion loss associated with the conventional SOI switch by replacing the conventional SOI switch with the MEMS switch, thus helping to improve RF efficiency and/or performance of the mobile communication device.

SUMMARY

Aspects disclosed in the detailed description include a radio frequency (RF) switching circuit. In examples disclosed herein, the RF switching circuit includes a low-figure-of-merit (FOM) switching path that requires a longer duration to be switched on and off. The RF switching circuit also includes a high-FOM switching path having a higher FOM than the low-FOM switching path but that can be switched on and off faster than the low-FOM switching path. In one aspect, the RF switching circuit passes an RF signal via the high-FOM switching path while toggling the low-FOM switching path (e.g., from "off" to "on" or from "on" to "off") to help reduce overall switching time of the RF switching circuit. In another aspect, the RF switching circuit passes the RF signal via the low-FOM switching path whenever the low-FOM switching path is switched on to help improve overall FOM of the RF switching circuit. As a result, the RF switching circuit may achieve a good overall response time and a reasonable overall FOM.

In one aspect, an RF switching circuit is provided. The RF switching circuit includes a signal input to receive an RF signal. The RF switching circuit also includes a signal output to output the RF signal. The RF switching circuit also includes a hybrid switch circuit. The hybrid switch circuit includes a low-FOM switching path coupled between the signal input and the signal output. The hybrid switch circuit also includes a high-FOM switching path coupled in parallel to the low-FOM switching path between the signal input and the signal output. The RF switching circuit also includes a control circuit. The control circuit is configured to cause the high-FOM switching path to be switched on earlier than the low-FOM switching path in a switch-on operation. The control circuit is also configured to cause the high-FOM switching path to be switched off later than the low-FOM switching path in a switch-off operation.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 3A is a graphic diagram providing an exemplary illustration of the RF switching circuit of FIG. 2 configured to perform switch-on and switch-off operations based on one embodiment of the present disclosure;

FIG. 3B is a graphic diagram providing an exemplary illustration of the RF switching circuit of FIG. 2 configured to perform switch-on and switch-off operations based on another embodiment of the present disclosure;

DETAILED DESCRIPTION

Figures 1A, 1B:
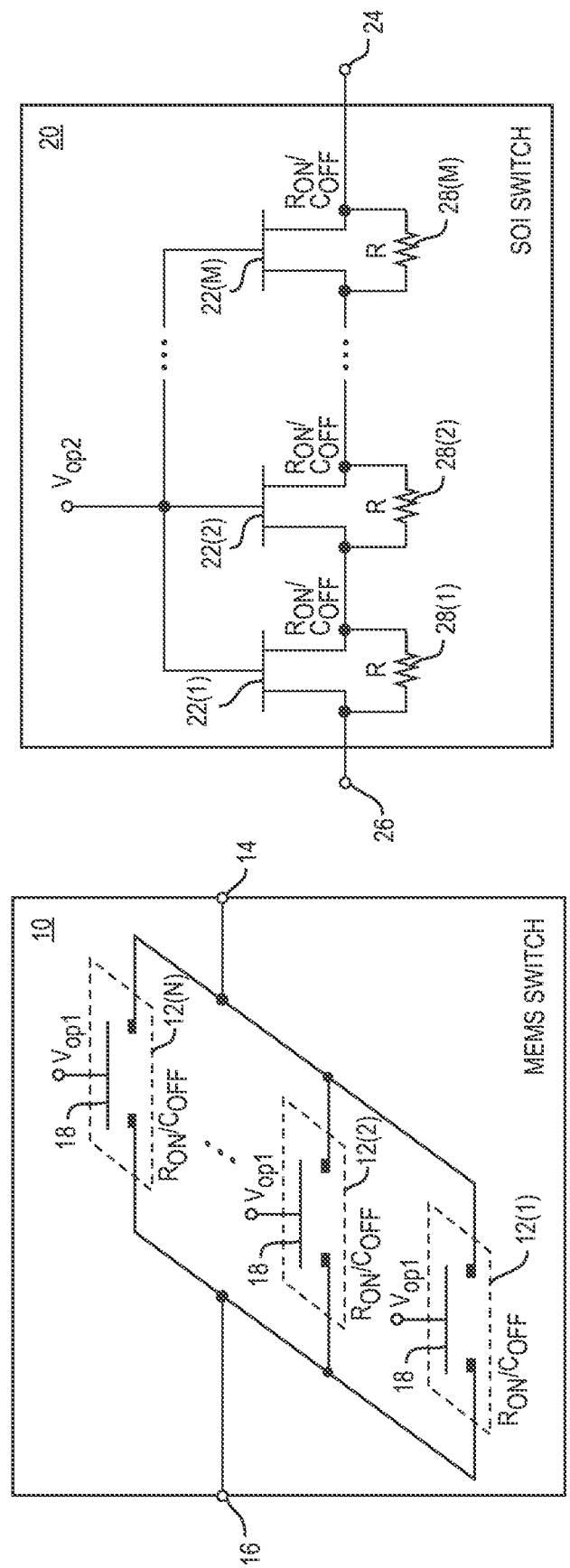
FIG. 1A is a schematic diagram of a microelectromechanical systems (MEMS) switch that typically exhibits a lower figure-of-merit (FOM) but a longer switching duration.
FIG. 1B is a schematic diagram of a silicon-on-insulator (SOI) switch that exhibits a higher FOM but a shorter switching duration.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a radio frequency (RF) switching circuit. In examples disclosed herein, the RF switching circuit includes a low-figure-of-merit (FOM) switching path having a lower FOM but requires a longer duration to be switched on and off. The RF switching circuit also includes a high-FOM switching path having a higher FOM than the low-FOM switching path but can be switched on and off faster than the low-FOM switching path. In one aspect, the RF switching circuit passes an RF signal via the high-FOM switching path while toggling the low-FOM switching path (e.g., from "off" to "on" or from "on" to "off") to help reduce overall switching time of the RF switching circuit. In another aspect, the RF switching circuit passes the RF signal via the low-FOM switching path whenever the low-FOM switching path is switched on to help improve overall FOM of the RF switching circuit. As a result, the RF switching circuit may achieve a good overall response time and a reasonable overall FOM.

Figure 2:
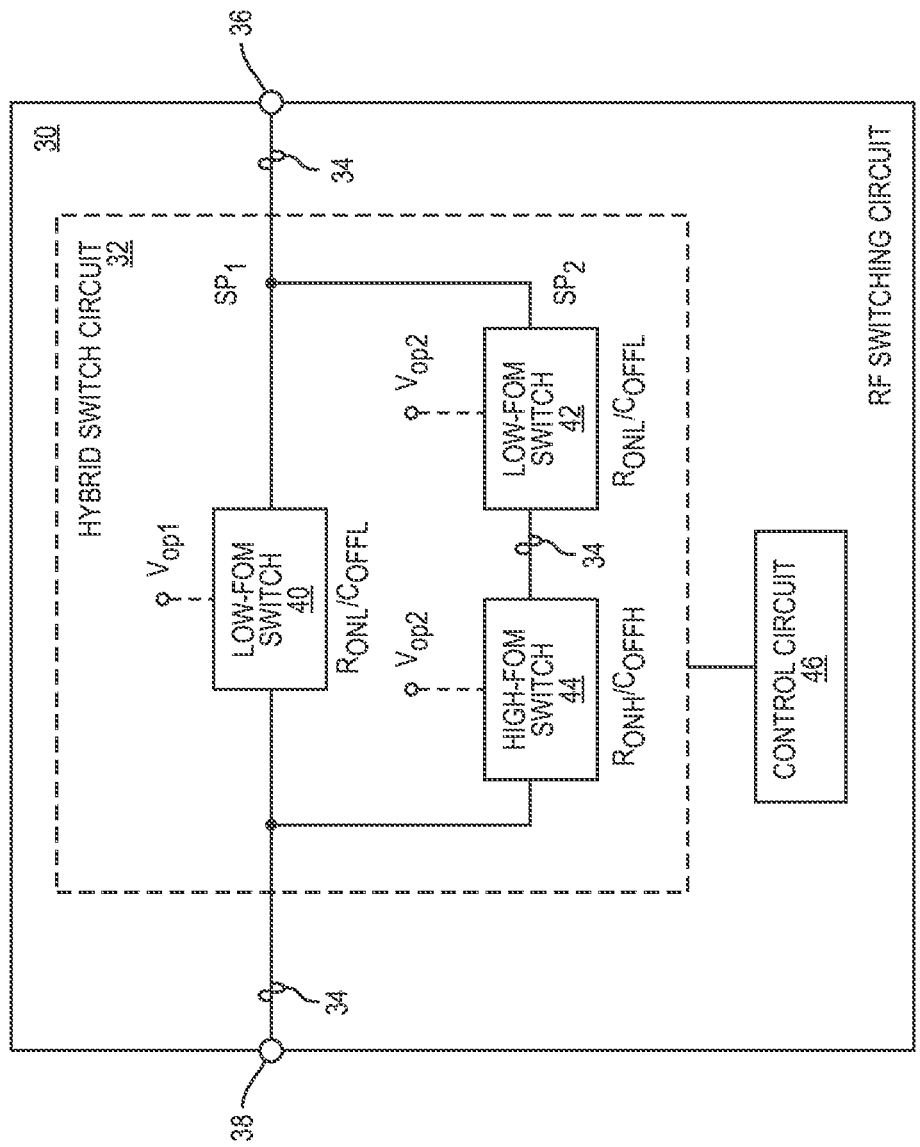
FIG. 2 is a schematic diagram of an exemplary radio frequency (RF) switching circuit configured according to an embodiment of the present disclosure to achieve a balance between overall FOM and switching duration.

Before discussing an RF switching circuit of the present disclosure starting at FIG. 2, a brief overview of a microelectromechanical systems (MEMS) switch and a silicon-on-insulator (SOI) switch is first provided with reference to FIGS. 1A and 1B to help understand pros and cons of the MEMS switch and the SOI switch.

In this regard, FIG. 1A is a schematic diagram of an exemplary MEMS switch 10 that typically exhibits a lower FOM but a longer switching duration. The MEMS switch 10 includes a number of switchlets 12(1)-12(N) coupled in parallel between a signal input 14 and a signal output 16. Each of the switchlets 12(1)-12(N) includes a respective MEMS switch 18 that can be closed by a respective operating voltage $V_{OP1}$ of approximately 30 volts. Each MEMS switch 18 exhibits an on-resistance ($R_{ON}$) when closed and an off-capacitance ($C_{OFF}$) when open. Accordingly, the MEMS switch 10 can exhibit a lower overall FOM that is typically less than 30 femtoseconds (fs). However, the MEMS switch 10 may require approximately 10 to 25 microseconds (μs) to be switched on or off.

FIG. 1B is a schematic diagram of an exemplary SOI switch 20 that typically exhibits a higher FOM but a shorter switching duration. The SOI switch 20 includes a number of field-effect transistors (FETs) 22(1)-22(M) coupled in series between a signal input 24 and a signal output 26. The FETs 22(1)-22(M) can be closed by a respective operating voltage $V_{OP2}$ of approximately 2.5 volts. Each of the FETs 22(1)-22(M) has a respective on-resistance ($R_{ON}$) when closed and a respective off-capacitance ($C_{OFF}$) when open. The FETs 22(1)-22(M) may be coupled in parallel to a number of resistors 28(1)-28(M), respectively. Each of the resistors 28(1)-28(M) has a respective resistance R. The SOI switch 20 can be switched on or off in approximately 0.2 μs. However, the SOI switch 20 can exhibit a higher overall FOM that is typically around 100 fs.

As discussed above, the MEMS switch 10 exhibits the lower FOM that can help reduce insertion loss but may be too slow to meet a more stringent switching time requirement (e.g., <2 μs) of some communication technologies, such as the fifth-generation new-radio (5G-NR) technology. On the other hand, the SOI switch 20 can meet the stringent switching time requirement of the 5G-NR technology but may introduce a higher insertion loss. As such, it may be necessary to make a proper trade-off between the FOM and the switching duration in an RF switching circuit used for the 5G-NR technology.

In this regard, FIG. 2 is a schematic diagram of an exemplary RF switching circuit 30 configured according to an embodiment of the present disclosure to achieve a balance between overall FOM and switching duration. As discussed in detail below, the RF switching circuit 30 includes a hybrid switch circuit 32 configured to capitalize on the lower FOM of the MEMS switch 10 in FIG. 1A and the shorter switching duration of the SOI switch 20 in FIG. 1B.

In a non-limiting example, the hybrid switch circuit 32 includes a low-FOM switching path $SP_1$ having a lower FOM but a longer switching duration and a high-FOM switching path $SP_2$ having a shorter switching duration but a higher FOM.

In one aspect, the RF switching circuit 30 passes an RF signal 34 via the high-FOM switching path $SP_2$ before the low-FOM switching path $SP_1$ is switched on. In this regard, the RF switching circuit 30 is able to achieve the shorter switching duration at an expense of the higher FOM. In another aspect, the RF switching circuit 30 passes the RF signal 34 via the low-FOM switching path $SP_1$ whenever the low-FOM switching path $SP_1$ is switched on, thus helping to improve an overall FOM of the RF switching circuit 30. By capitalizing on the shorter switching duration of the high-FOM switching path $SP_2$ and the lower FOM of the low-FOM switching path $SP_1$, it may be possible for the RF switching circuit 30 to meet the stringent switching time requirement of the 5G-NR technology with reasonable overall FOM.

The low-FOM switching path SP1 and the high-FOM switching path SP2 are coupled in parallel between a signal input 36, which receives an RF signal 34, and a signal output 38, which outputs the RF signal 34. The low-FOM switching path $SP_1$ includes a first low-FOM switch 40 coupled between the signal input 36 and the signal output 38. The high-FOM switching path $SP_2$ includes a second low-FOM switch 42 and a high-FOM switch 44. The second low-FOM switch 42 is coupled to the signal input 36 and the high-FOM switch 44 is coupled between the second low-FOM switch 42 and the signal output 38.

In a non-limiting example, the first low-FOM switch 40 and the second low-FOM switch 42 are identical to the MEMS switch 10 of FIG. 1A, which can be closed by the operating voltage $V_{OP1}$. Accordingly, the first low-FOM switch 40 and the second low-FOM switch 42 both exhibit the lower FOM (e.g., <40 fs) and the longer switching duration (e.g., 10-25 μs). Like the MEMS switch 10, each of the first low-FOM switch 40 and the second low-FOM switch 42 is associated with an on-resistance $R_{ONL}$ and an off-capacitance $C_{OFFL}$. In a non-limiting example, the second low-FOM switch 42 is configured to have a lesser number of the switchlets 12(1)-12(N) in FIG. 1A than the first low-FOM switch 40. Accordingly, the second low-FOM switch 42 may have a smaller footprint than the first low-FOM switch 40.

The high-FOM switch 44 may be identical to the SOI switch 20 of FIG. 1B, which can be closed by the operating voltage $V_{OP2}$. Accordingly, the high-FOM switch 44 exhibits the higher FOM (e.g., 100 fs) and the shorter switching duration (e.g., 0.2 μs). Like the SOI switch 20, the high-FOM switch 44 is associated with an on-resistance $R_{ONH}$ and an off-capacitance $C_{OFFH}$. It should be appreciated that the high-FOM switch 44 can also be any other type of switch that can achieve a similar switching duration as the SOI switch 20.

The RF switching circuit 30 can further include a control circuit 46, which can be a field-programmable gate array (FPGA), as an example. As described in detail in FIGS. 3A and 3B below, the control circuit 46 can be configured to cause the high-FOM switching path $SP_2$ to be switched on earlier than the low-FOM switching path $SP_1$ in a switch-on operation and to cause the high-FOM switching path $SP_2$ to be switched off later than the low-FOM switching path $SP_1$ in a switch-off operation.

In examples discussed herein, the switch-on operation refers to an operation to close both the low-FOM switching path $SP_1$ and the high-FOM switching path $SP_2$. Specifically, the low-FOM switching path $SP_1$ is considered as being closed when the first low-FOM switch 40 is closed, and the high-FOM switching path $SP_2$ is considered as being closed when both the second low-FOM switch 42 and the high-FOM switch 44 are closed. In contrast, the switch-off operation refers to an operation to open both the low-FOM switching path $SP_1$ and the high-FOM switching path $SP_2$. Specifically, the low-FOM switching path $SP_1$ is considered as being open when the first low-FOM switch 40 is open, and the high-FOM switching path $SP_2$ is considered as being open when at least one of the second low-FOM switch 42 and the high-FOM switch 44 is open.

FIG. 3A is a graphic diagram providing an exemplary illustration of the RF switching circuit 30 of FIG. 2 configured to perform switch-on and switch-off operations based on one embodiment of the present disclosure. In examples discussed herein, the RF switching circuit 30 is performing the switch-on operation between time $T_0$ and $T_3$ and the switch-off operation between time $T_3$ and $T_5$.

Prior to the switch-on operation, the first low-FOM switch 40, the second low-FOM switch 42, and the high-FOM switch 44 are all in an "open" state. In this regard, the first low-FOM switch 40 and the second low-FOM switch 42 each exhibit the off-capacitance $C_{OFFL}$, and the high-FOM switch 44 exhibits the off-capacitance $C_{OFFH}$. Accordingly, the low-FOM switching path SP1 and the high-FOM switching path SP2 can have respective off-capacitances $C_{OFF-SP1}$ and $C_{OFF-SP2}$ as expressed in equations (Eq. 1.1 and 12) below.

$$C_{OFF-SP1} = C_{OFFL} \qquad \text{(Eq. 1.1)}$$

$$C_{OFF-SP2} = 1/[(1/C_{OFFH}) + (1/C_{OFFL})] \qquad \text{(Eq. 1.2)}$$

Accordingly, the RF switching circuit 30 can have an overall off-capacitance $C_{OFF-ALL}$ as expressed in equation (Eq. 1.3) below.

$$C_{OFF-ALL} = C_{OFFL} + 1/[(1/C_{OFFH}) + (1/C_{OFFL})] \qquad \text{(Eq. 1.3)}$$

At time $T_0$ (also referred to as "first switch-on time" herein), the control circuit 46 toggles the second low-FOM switch 42 from the "open" state to a "closed" state such that the second low-FOM switch 42 becomes fully closed at time $T_1$ (also referred to as "second switch-on time" herein). In this regard, the duration from the time $T_0$ to the time $T_1$ may correspond to the switching duration (e.g., 10-25 μs) of the second low-FOM switch 42. Notably, the time $T_1$ may correspond to a desired switch-on time of the RF switching circuit 30. As such, the control circuit 46 actually causes the second low-FOM switch 42 to close ahead of the desired switch-on time to help reduce overall response time of the RF switching circuit 30.

At the time $T_1$, which corresponds to the desired switch-on time of the RF switching circuit 30, the control circuit 46 concurrently toggles both the first low-FOM switch 40 and the high-FOM switch 44 from the "open" state to the "closed" state. According to earlier discussions, the high-FOM switch 44 has a shorter switching duration than the first low-FOM switch 40. Therefore, the high-FOM switch 44 becomes fully closed at time $T_{ON}$, while the first low-FOM switch 40 is still in the transition from the "open" state to the "closed" state. In this regard, the duration from the time $T_1$ to the time $T_{ON}$ may correspond to the switching duration (e.g., 0.2 μs) of the high-FOM switch 44. As a result, the high-FOM switching path $SP_2$ is switched on at the time $T_{ON}$. Accordingly, the RF signal 34 can pass from the signal input 36 to the signal output 38 via the high-FOM switching path $SP_2$. As both the high-FOM switch 44 and the second low-FOM switch 42 are in the "closed" state, the high-FOM switching path $SP_2$ exhibits a respective on-resistance $R_{ON-SP2}$ as expressed in equation (Eq. 2) below.

$$R_{ON-SP2} = R_{ONH} + R_{ONL} \quad \text{(Eq. 2)}$$

Accordingly, the high-FOM switching path $SP_2$ can correspond to a respective $FOM_{SP2}$ (also referred as "second FOM") as expressed in equation (Eq. 3.1) below.

$$FOM_{SP2} = R_{ON-SP2} * C_{OFF-SP2} \quad \text{(Eq. 3.1)}$$

Thus, according to equations (Eq. 1.2, 2, and 3.1), the $FOM_{SP2}$ can be further expressed as in equation (Eq. 3.2) below.

$$\begin{aligned} FOM_{SP2} &= (R_{ONH} + R_{ONL}) * 1/[(1/C_{OFFH}) + \\ &\quad (1/C_{OFFL})] \\ &= (R_{ONH} + R_{ONL}) * C_{OFFH} * C_{OFFL} / \\ &\quad (C_{OFFH} + C_{OFFL}) \end{aligned} \quad \text{(Eq. 3.2)}$$

At the time $T_2$, the first low-FOM switch 40 becomes fully closed. Accordingly, the low-FOM switching path $SP_1$ is switched on. In this regard, the duration from the time $T_1$ to the time $T_2$ may correspond to the switching duration (e.g., 10-25 μs) of the first low-FOM switch 40. In this regard, the low-FOM switching path $SP_1$ exhibits a respective on-resistance $R_{ON-SP1}$ and a respective $FOM_{SP1}$ (also referred to as "first FOM") as expressed in equations (Eq. 4.1 and 4.2) below.

$$R_{ON-SP1} = R_{ONL} \quad \text{(Eq. 4.1)}$$

$$FOM_{SP1} = R_{ONL} * C_{OFFL} \quad \text{(Eq. 4.2)}$$

Based on equations (Eq. 2 and 4.1), the low-FOM switching path $SP_1$ has a lower on-resistance than the high-FOM switching path $SP_2$. As a result, at least a majority of the RF signal 34 will be passing from the signal input 36 to the signal output 38 via the low-FOM switching path $SP_1$ as soon as the low-FOM switching path $SP_1$ is switched on. By comparing equations (Eq. 3.2 and 4), it can be seen that the $FOM_{SP2}$ of the high-FOM switching path $SP_2$ is higher than the $FOM_{SP1}$ of the low-FOM switching path $SP_1$. In a non-limiting example, the $FOM_{SP2}$ can be at least two times of the $FOM_{SP1}$ ($FOM_{SP2} \geq 2\ FOM_{SP1}$). For example, the $FOM_{SP1}$ can be 40 fs and the $FOM_{SP2}$ can be 100 fs. As such, the RF switching circuit 30 temporarily exhibits the higher $FOM_{SP2}$ between the time $T_{ON}$ and the time $T_2$ and will exhibit the lower $FOM_{SP1}$ at the time $T_2$. In this regard, the RF switching circuit 30 can achieve the shorter switching duration between the time $T_1$ and the time $T_{ON}$ at an expense of the temporarily higher $FOM_{SP2}$ between the time $T_{ON}$ and the time $T_2$.

As both the low-FOM switching path $SP_1$ and the high-FOM switching path $SP_2$ are switched on, the RF switching circuit 30 can exhibit an overall on-resistance $R_{ON-ALL}$ as expressed in equation (Eq. 5) below.

$$R_{ON-ALL} = (1/R_{ONL}) + 1/(R_{ONL} + R_{ONH}) \quad \text{(Eq. 5)}$$

Thus, based on equations (Eq. 1.3 and 5), the RF switching circuit 30 can have an overall $FOM_{ALL}$ as expressed in equation (Eq. 6) below.

$$\begin{aligned} FOM_{ALL} &= R_{ON-ALL} * C_{OFF-ALL} \\ &= \{(1/R_{ONL}) + 1/(R_{ONL} + R_{ONH})\} * \\ &\quad \{C_{OFFL} + 1/[(1/C_{OFFH}) + (1/C_{OFFL})]\} \end{aligned} \quad \text{(Eq. 6)}$$

Prior to the switch-off operation performed between time $T_3$ and $T_5$, the first low-FOM switch 40, the second low-FOM switch 42, and the high-FOM switch 44 are all in a "closed" state. As such, the RF signal 34 is passed from the signal input 36 to the signal output 38 via the low-FOM switching path $SP_1$ and the RF switching circuit 30 thus exhibiting the lower $FOM_{SP1}$ between the time $T_2$ and the time $T_3$.

At the time $T_3$ (also referred to as "first switch-off time" herein), the control circuit 46 toggles the first low-FOM switch 40 from the "closed" state to the "open" state such that the first low-FOM switch 40 becomes fully open at time $T_4$ (also referred to as "second switch-off time" herein). In this regard, the duration from the time $T_3$ to the time $T_4$ may correspond to the switching duration (e.g., 10-25 μs) of the first low-FOM switch 40. Notably, the time $T_4$ may correspond to a desired switch-off time of the RF switching circuit 30. As such, the control circuit 46 actually causes the first low-FOM switch 40 to close ahead of the desired switch-off time to help reduce overall response time of the RF switching circuit 30.

By toggling the first low-FOM switch 40, the low-FOM switching path $SP_1$ is switched off. As such, the RF switching circuit 30 reroutes the RF signal 34 to pass from the signal input 36 to the signal output 38 via the high-FOM switching path $SP_2$.

At the time $T_4$, the control circuit 46 concurrently toggles both the second low-FOM switch 42 and the high-FOM switch 44 from the "closed" state to the "open" state. According to earlier discussions, the high-FOM switch 44 has a shorter switching duration than the second low-FOM switch 42. Therefore, the high-FOM switch 44 becomes fully open at time $T_{OFF}$, while the second low-FOM switch 42 is still in the transition from the "closed" state to the "open" state. In this regard, the duration from the time $T_4$ to the time $T_{OFF}$ may correspond to the switching duration (e.g., 0.2 μs) of the high-FOM switch 44. As the high-FOM switch 44 is open at the time $T_{OFF}$, the high-FOM switching path $SP_2$ is switched off and the RF signal 34 is blocked. In this regard, the RF switching circuit 30 exhibits the higher $FOM_{SP2}$ between the time $T_3$ and the time $T_{OFF}$. In this regard, the RF switching circuit 30 temporarily exhibits the higher $FOM_{SP2}$ between the time $T_3$ and the time $T_{OFF}$ in exchange for the shorter switching duration between the time $T_4$ and the time $T_{OFF}$.

At the time $T_5$, the second low-FOM switch 42 also becomes fully closed. At this point, the RF switching circuit 30 is completed switched off.

As discussed above, the RF switching circuit 30 is able to achieve the shorter switch-on and switch-off durations at the expense of exhibiting the higher $FOM_{SP2}$ between the time $T_{ON}$ and the time $T_2$ as well as between the time $T_3$ and the time $T_{OFF}$. As such, it may be desirable to further reduce the duration of the higher $FOM_{SP2}$ in the RF switching circuit 30, while maintaining the shorter switch-on and switch-off durations.

In this regard, FIG. 3B is a graphic diagram providing an exemplary illustration of the RF switching circuit 30 of FIG. 2 configured to perform switch-on and switch-off operations based on another embodiment of the present disclosure. Prior to the switch-on operation, the first low-FOM switch 40, the second low-FOM switch 42, and the high-FOM switch 44 are all in an "open" state.

At time $T_0$ (also referred to as "first switch-on time" herein) the control circuit 46 toggles the second low-FOM switch 42 from the "open" state to a "closed" state such that the second low-FOM switch 42 becomes fully closed at time $T_1$ (also referred to as "second switch-on time" herein). In this regard, the duration from the time $T_0$ to the time $T_1$ may correspond to the switching duration (e.g., 10-25 μs) of the second low-FOM switch 42. Notably, the time $T_1$ may correspond to a desired switch-on time of the RF switching circuit 30. As such, the control circuit 46 actually causes the second low-FOM switch 42 to close ahead of the desired switch-on time to help reduce overall response time of the RF switching circuit 30.

At time $T_{0-1}$ (also referred to as "third switch-on time" herein), which is in between the time $T_0$ and the time $T_1$, the control circuit 46 begins to toggle the first low-FOM switch 40 from the "open" state to the "closed" state. Notably, the time $T_{0-1}$ is so determined to prevent the first low-FOM switch 40 from becoming fully closed at the time $T_1$. In this regard, the first low-FOM switch 40 remains in the "open" state at the time $T_1$.

At the time $T_1$, which corresponds to the desired switch-on time of the RF switching circuit 30, the control circuit 46 toggles the high-FOM switch 44 from the "open" state to the "closed" state. According to earlier discussions, the high-FOM switch 44 has a shorter switching duration than the first low-FOM switch 40. Therefore, the high-FOM switch 44 becomes fully closed at time $T_{ON}$, while the first low-FOM switch 40 is still in the transition from the "open" state to the "closed" state. In this regard, the duration from the time $T_1$ to the time $T_{ON}$ may correspond to the switching duration (e.g., 0.2 μs) of the high-FOM switch 44. As a result, the high-FOM switching path $SP_2$ is switched on at the time $T_{ON}$. Accordingly, the RF signal 34 can pass from the signal input 36 to the signal output 38 via the high-FOM switching path $SP_2$ and the RF switching circuit 30 exhibits the higher $FOM_{SP2}$ at the time $T_{ON}$.

At the time $T_2$, the first low-FOM switch 40 becomes fully closed and the low-FOM switching path $SP_1$ is switched on. In this regard, at least a majority of the RF signal 34 will be passing from the signal input 36 to the signal output 38 via the low-FOM switching path $SP_1$ as soon as the low-FOM switching path $SP_1$ is switched on. As a result, the RF switching circuit 30 exhibits the lower $FOM_{SP1}$ at the time $T_2$. Notably, since the control circuit 46 begins to toggle the first low-FOM switch 40 ahead of the desired switch-on the time $T_1$, the first low-FOM switch 40 can thus become fully closed earlier than the first low-FOM switch 40 does in FIG. 3A. As such, the duration in which the RF switching circuit 30 exhibits the higher $FOM_{SP2}$ can be shortened.

Prior to the switch-off operation performed between the time $T_3$ and time $T_5$, the first low-FOM switch 40, the second low-FOM switch 42, and the high-FOM switch 44 are all in a "closed" state. As such, the RF signal 34 is passed from the signal input 36 to the signal output 38 via the low-FOM switching path $SP_1$ and the RF switching circuit thus exhibiting the lower $FOM_{SP1}$ between the time $T_2$ and the time $T_3$.

At the time $T_3$ (also referred to as "first switch-off time" herein), the control circuit 46 toggles the first low-FOM switch 40 from the "closed" state to the "open" state such that the first low-FOM switch 40 becomes fully open at time $T_4$ (also referred to as "second switch-off time" herein). Notably, the time $T_3$ in FIG. 3B is delayed from the time $T_3$ in FIG. 3A. Accordingly, the time $T_4$ in FIG. 3B is also delayed from the time $T_4$ in FIG. 3A.

The control circuit 46 concurrently toggles the high-FOM switch 44 and the second low-FOM switch 42 at time $T_{3-4}$ (also referred to as "third switch-off time" herein) that is in between of the time $T_3$ and the time $T_4$. Notably, the time $T_{3-4}$ may correspond to a desired switch-off time of the RF switching circuit 30. The time $T_{3-4}$ may be so determined to prevent the first low-FOM switch 40 from becoming fully open at the time $T_{3-4}$. In other words, the first low-FOM switch 40, and thus the low-FOM switching path $SP_1$, remains closed at the time $T_{3-4}$ to pass the RF signal 34. As a result, the RF switching circuit 30 would exhibit the lower $FOM_{SP1}$ longer than in FIG. 3A.

At the time $T_{3-4}$, the control circuit 46 concurrently toggles both the second low-FOM switch 42 and the high-FOM switch 44 from the "closed" state to the "open" state. According to earlier discussions, the high-FOM switch 44 has a shorter switching duration than the second low-FOM switch 42. Therefore, the high-FOM switch 44 becomes fully open at time $T_{OFF}$, while the second low-FOM switch 42 is still in the transition from the "closed" state to the "open" state. In this regard, the duration from the time $T_{3-4}$ to the time $T_{OFF}$ may correspond to the switching duration (e.g., 0.2 μs) of the high-FOM switch 44. As the high-FOM switch 44 is open at the time $T_{OFF}$, the high-FOM switching path $SP_2$ is switched off and the RF signal 34 is blocked. In this regard, the RF switching circuit 30 exhibits the higher $FOM_{SP2}$ between the time $T_{3-4}$ and the time $T_{OFF}$, which is shorter than the higher $FOM_{SP2}$ exhibited between the time $T_3$ and the time $T_4$ in FIG. 3A. At the time $T_5$, the second low-FOM switch 42 also becomes fully closed. At this point, the RF switching circuit 30 is completed switched off.

Figure 4:
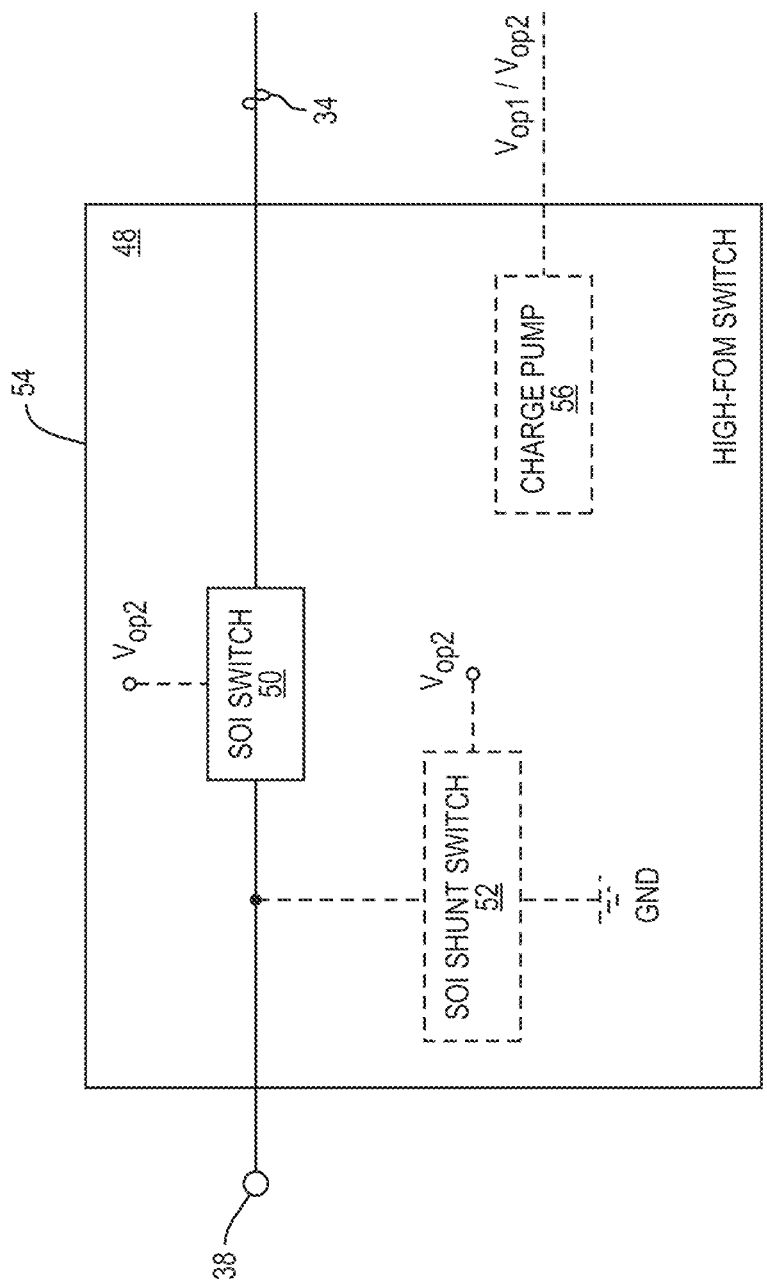
FIG. 4 is a schematic diagram of an exemplary high-FOM switch that may be provided in the RF switching circuit of FIG. 2.

As mentioned earlier, the high-FOM switch 44 in the RF switching circuit 30 can be an SOI switch or any other type of switch that exhibits a shorter switching duration. FIG. 4 is a schematic diagram of an exemplary high-FOM switch 48 that may be provided in the RF switching circuit 30 of FIG. 2 as the high-FOM switch 44. Common elements between FIGS. 2 and 4 are shown therein with common element numbers and will not be re-described herein.

In a non-limiting example, the high-FOM switch 48 includes an SOI switch 50, which may be identical to the SOI switch 20 of FIG. 1B. The high-FOM switch 48 may also include a SOI shunt switch 52 coupled between the signal output 38 and a ground GND. Both the SOI switch 50 and the SOI shunt switch 52 may be closed by the operating voltage $V_{OP2}$. In a non-limiting example, the high-FOM switch 48 may be provided in a complementary metal-oxide semiconductor (CMOS) die 54.

The CMOS die 54 may be further configured to incorporate a charge pump 56. The charge pump 56 may be configured to generate the operating voltage $V_{OP1}$ for closing the first low-FOM switch 40 and the second low-FOM switch 42. The charge pump 56 may also be configured to generate the operating voltage $V_{OP2}$ for closing the SOI switch 50 and the SOI shunt switch 52.

Figure 5:
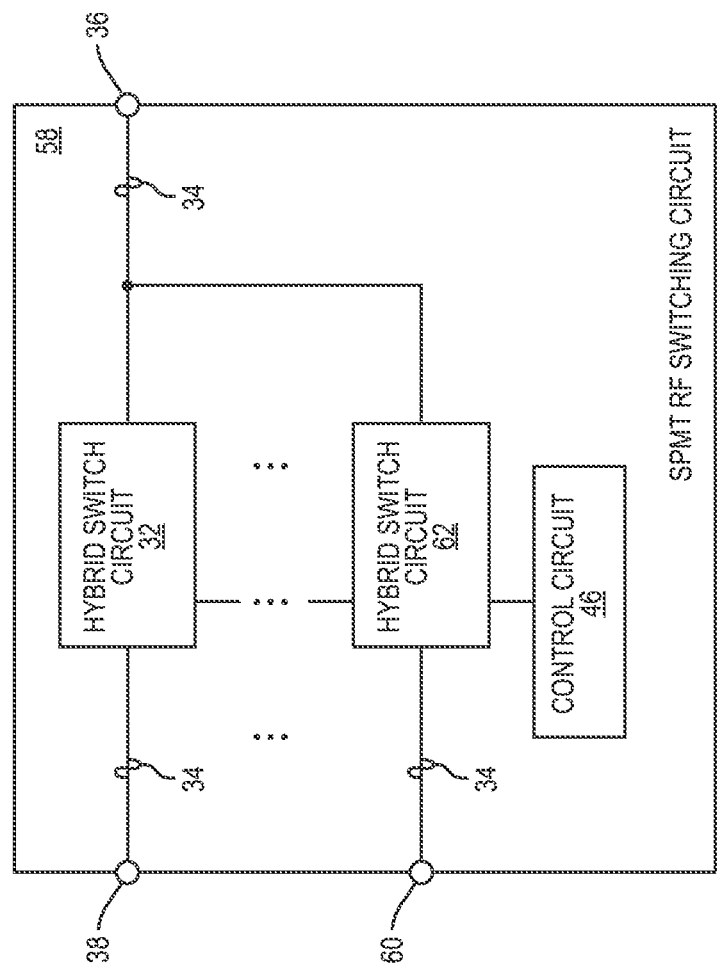
FIG. 5 is a schematic diagram of an exemplary single-pole multi-throw (SPMT) RF switching circuit.

Although the RF switching circuit 30 of FIG. 2 is illustrated as a single-pole single-through (SPST) switching circuit, it should be appreciated that the RF switching circuit 30 can be configured to operate as a single-pole multi-throw (SPMT) switching circuit as well. In this regard, FIG. 5 is a schematic diagram of an exemplary SPMT RF switching circuit 58 configured according to an embodiment of the present disclosure. Common elements between FIGS. 2 and 5 are shown therein with common element numbers and will not be re-described herein.

In a non-limiting example, the SPMT RF switching circuit 58 includes at least one second signal output 60 to output the RF signal 34. The SPMT RF switching circuit 58 also includes at least one second hybrid switch circuit 62 coupled between the signal input 36 and the second signal output 60. The second hybrid switch circuit 62 may be identical to the hybrid switch circuit 32.

Those skilled in the art will recognize improvements and modifications to the embodiments of the present disclosure. All such improvements and modifications are considered within the scope of the concepts disclosed herein and the claims that follow.

What is claimed is:

1. A radio frequency (RF) switching circuit comprising:
   a signal input to receive an RF signal;
   a signal output to output the RF signal;
   a hybrid switch circuit comprising:
      a low-figure-of-merit (FOM) switching path coupled between the signal input and the signal output; and
      a high-FOM switching path coupled in parallel to the low-FOM switching path between the signal input and the signal output; and
   a control circuit configured to:
      cause the high-FOM switching path to be switched on earlier than the low-FOM switching path in a switch-on operation and remain switched on until the low-FOM switching path is switched off; and
      cause the high-FOM switching path to be switched off later than the low-FOM switching path in a switch-off operation.

2. The RF switching circuit of claim 1 wherein the hybrid switch circuit is configured to pass the RF signal from the signal input to the signal output via the low-FOM switching path when the low-FOM switching path is switched on.

3. The RF switching circuit of claim 1 wherein the hybrid switch circuit is configured to pass the RF signal from the signal input to the signal output via the high-FOM switching path when the low-FOM switching path is switched off.

4. The RF switching circuit of claim 1 wherein:
   the low-FOM switching path comprises a first low-FOM switch coupled between the signal input and the signal output, the first low-FOM switch having a first FOM and corresponding to a first switching duration; and
   the high-FOM switching path comprises:
      a second low-FOM switch coupled to the signal input, the second low-FOM switch having the first FOM and corresponding to the first switching duration; and
      a high-FOM switch coupled between the second low-FOM switch and the signal output, the high-FOM switch having a second FOM higher than the first FOM and corresponding to a second switching duration shorter than the first switching duration.

5. The RF switching circuit of claim 4 wherein in the switch-on operation, the control circuit is further configured to:
   close the first low-FOM switch to switch on the low-FOM switching path; and
   close the second low-FOM switch and the high-FOM switch to switch on the high-FOM switching path.

6. The RF switching circuit of claim 5 wherein the control circuit is further configured to:

toggle the second low-FOM switch at a first switch-on time to cause the second low-FOM switch to close at a second switch-on time after the first switch-on time; and
toggle the high-FOM switch and the first low-FOM switch concurrently at the second switch-on time.

7. The RF switching circuit of claim 5 wherein the control circuit is further configured to:
   toggle the second low-FOM switch at a first switch-on time to cause the second low-FOM switch to close at a second switch-on time after the first switch-on time;
   toggle the high-FOM switch at the second switch-on time; and
   toggle the first low-FOM switch at a third switch-on time in between the first switch-on time and the second switch-on time.

8. The RF switching circuit of claim 7 wherein the third switch-on time is determined to prevent the first low-FOM switch from being fully closed at the second switch-on time.

9. The RF switching circuit of claim 4 wherein the control circuit is further configured to:
   open the first low-FOM switch to switch off the low-FOM switching path; and
   open at least one of the second low-FOM switch and the high-FOM switch to switch off the high-FOM switching path.

10. The RF switching circuit of claim 9 wherein the control circuit is further configured to:
    toggle the first low-FOM switch at a first switch-off time to cause the first low-FOM switch to open at a second switch-off time after the first switch-off time; and
    toggle the high-FOM switch and the second low-FOM switch concurrently at the second switch-off time.

11. The RF switching circuit of claim 9 wherein the control circuit is further configured to:
    toggle the first low-FOM switch at a first switch-off time to cause the first low-FOM switch to open at a second switch-off time after the first switch-off time; and
    toggle the high-FOM switch and the second low-FOM switch concurrently at a third switch-off time after the first switch-off time and before the second switch-off time.

12. The RF switching circuit of claim 11 wherein the third switch-off time is determined to prevent the first low-FOM switch from being fully open at the third switch-off time.

13. The RF switching circuit of claim 4 wherein the first low-FOM switch and the second low-FOM switch are microelectromechanical systems (MEMS) switches.

14. The RF switching circuit of claim 13 wherein the second low-FOM switch comprises a lesser number of switchlets than the first low-FOM switch.

15. The RF switching circuit of claim 4 wherein the high-FOM switch comprises a silicon-on-insulator (SOI) switch.

16. The RF switching circuit of claim 15 wherein the SOI switch is provided in a complementary metal-oxide semiconductor (CMOS) die.

17. The RF switching circuit of claim 16 wherein the CMOS die comprises an SOI shunt switch coupled between the signal output and a ground.

18. The RF switching circuit of claim 16 wherein the CMOS die comprises a charge pump configured to generate an operating voltage for closing the first low-FOM switch and the second low-FOM switch.

19. The RF switching circuit of claim 16 wherein the CMOS die comprises:

an SOI shunt switch coupled between the signal output and a ground; and a charge pump configured to generate an operating voltage for closing the first low-FOM switch and the second low-FOM switch.

20. The RF switching circuit of claim 1 further comprising:

at least one second signal output to output the RF signal; and at least one second hybrid switch circuit coupled between the signal input and the at least one second signal output.

* * * * *